United States Patent [19]

Nelson

[11] Patent Number: 4,819,251
[45] Date of Patent: Apr. 4, 1989

[54] HIGH SPEED NON-RETURN-TO-ZERO DIGITAL CLOCK RECOVERY APPARATUS

[75] Inventor: Blaine J. Nelson, Plano, Tex.

[73] Assignee: Rockwell International Corporation, El Segundo, Calif.

[21] Appl. No.: 190,913

[22] Filed: May 6, 1988

[51] Int. Cl.⁴ .............................................. H03L 7/00
[52] U.S. Cl. ................................... 375/119; 331/1 A; 328/74
[58] Field of Search .................... 375/81, 119, 120; 331/1 A, 19; 328/38, 63, 74, 75, 155

[56] References Cited

U.S. PATENT DOCUMENTS

| | | | |
|---|---|---|---|
| 3,935,538 | 1/1976 | Kizler et al. | 328/74 |
| 4,641,323 | 2/1987 | Tsang | 375/119 |
| 4,733,197 | 3/1988 | Chow | 331/1 A |

Primary Examiner—Benedict V. Safourek
Attorney, Agent, or Firm—Bruce C. Lutz; V. Lawrence Sewell; H. Fredrick Hamann

[57] ABSTRACT

A digital clock recovery circuit is presented which uses a delay line to produce a plurality of delayed sample signals. The sample signals are used to sample incoming data in a phase detector and the resultant sampled data is then resampled by the tentatively correct apparatus clock output signal. The resampled data provides a direct indication of the phase difference beween the data and the clock and the value can be obtained using a summing circuit. If the summed amount is outside an allowable range of values, a phase altering signal is supplied to an oscillator to change the phase of the apparatus clock output signal.

5 Claims, 6 Drawing Sheets

HIGH SPEED NON-RETURN-TO-ZERO DIGITAL CLOCK RECOVERY APPARATUS

THE INVENTION

The present invention is generally related to electronics and more spec related to a clock recovery circuit using digital techniques. Even more specifically, the present invention is concerned with a digital clock recovery circuit which circuit does not have to be able to operate at signal frequencies substantially different from the data repetition rate of the data being processed.

BACKGROUND

Prior art analog clock recovery circuits typically are slow or, in other words, have a long response time. Further, analog circuitry typically uses considerably more power than digital circuitry performing an identical operation.

Typical prior art digital circuits have required a high sampling rate to obtain appropriate phase discrimination in a clock recovery circuit or phase lock loop type apparatus. The Nyquist sampling theorem requires that the minimum sampling rate be twice the maximum data repetition rate and in practice, a sampling frequency at least eight times the data rate is desirable. If the data being sampled is already of a very high frequency such as 50 megahertz, then a sampling frequency of somewhere in the neighborhood of 400 to 500 megahertz would be required for appropriate phase discrimination using prior art techniques. Such frequencies require the use of very expensive gallium arsenide circuitry rather than the more commonly available CMOS circuits since CMOS circuitry typically has a limitation in state machine environments of approximately 70 megahertz even though the maximum frequency of operation for a single flip-flop could be as high as 250 megahertz.

The present invention allows the use of CMOS while still obtaining appropriate phase resolution in the phase detector by passing a signal through a device such as a delay line to obtain a plurality of signals each having slightly different phases and all of a frequency similar to the repetition rate of the data being detected. This multiple phase set of signals is then logically combined with the incoming data and a tentatively correct recovered clock is generated to obtain information as to the relative phase of the data and the tentative clock whereby a correction signal can be provided to an oscillator that is used to produce this clock in a feedback manner.

It is thus an object of the present invention to provide a digital clock recovery circuit which does not require that the operational frequency capability of the components be substantially higher than the repetition rate of the data being detected.

Other objects and advantages of the present invention will be apparent from a reading of the specification and appended claims in conjunction with the drawings wherein:

DETAILED DESCRIPTION

I wish to incorporate the contents of two patent applications filed in my name and assigned to the same assignee as the present invention and filed of even date herewith. These patent applications provide more detail as to the phase detector and oscillator blocks illustrated herein and have been given designations 88CR013 and 88CR014 for the oscillator and phase detector respectively.

Figure 1:
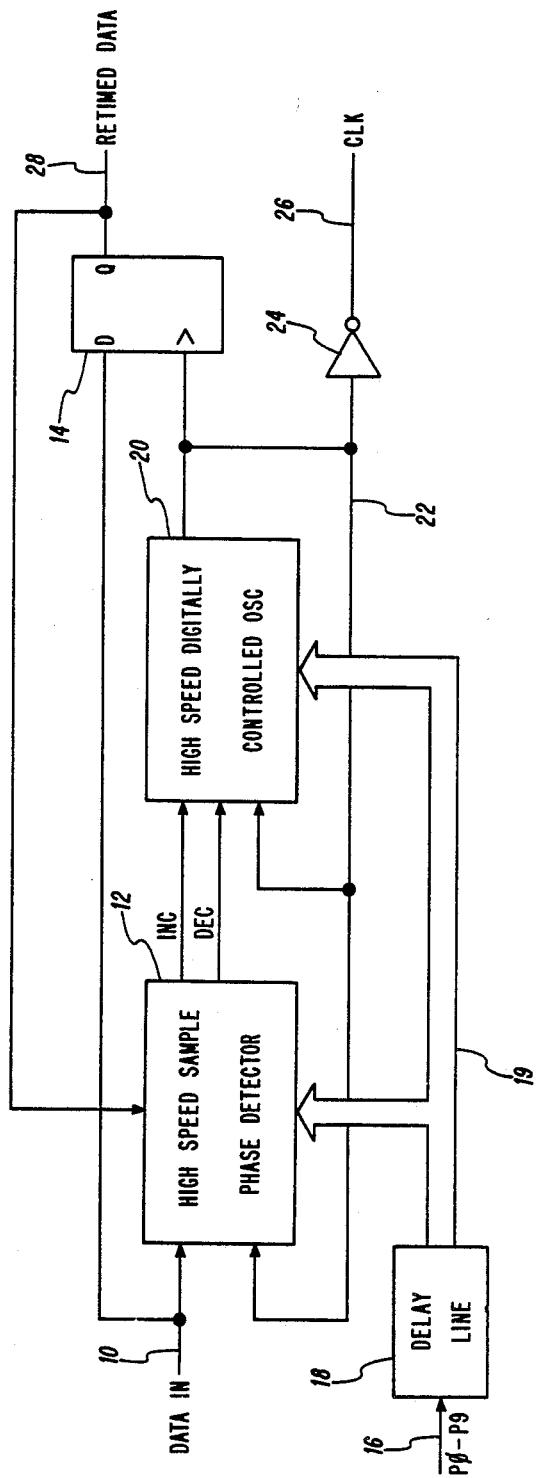
FIG. 1 is a block diagram of the overall inventive concept.

In FIG. 1 a Data In line 10 is utilized to provide signals to a high speed sampled phase detector 12 and to a D flip-flop 14. A signal source supplies signals on a lead 16 to a delay line 18 which provides a plurality (N) of output signals from P0 through P9 to the phase detector 12 and to a digitally controlled oscillator 20. Tentative clock signals are supplied as an output from oscillator 20 on a lead 22 and supplied to the D flip-flop 14 and the phase detector 12 as well as being returned to the oscillator 20 for use in a control section thereof. This clock, in some embodiments, will be inverted in an inverter such as 24 before being supplied as an apparatus output clock signal on lead 26. A lead 28 is used to designate the lead supplying retimed data which is in the desired phase relationship with respect to the clock on lead 26. Lead 28 is also connected to detector 12 to provide appropriate timing for control functions.

Figure 2:
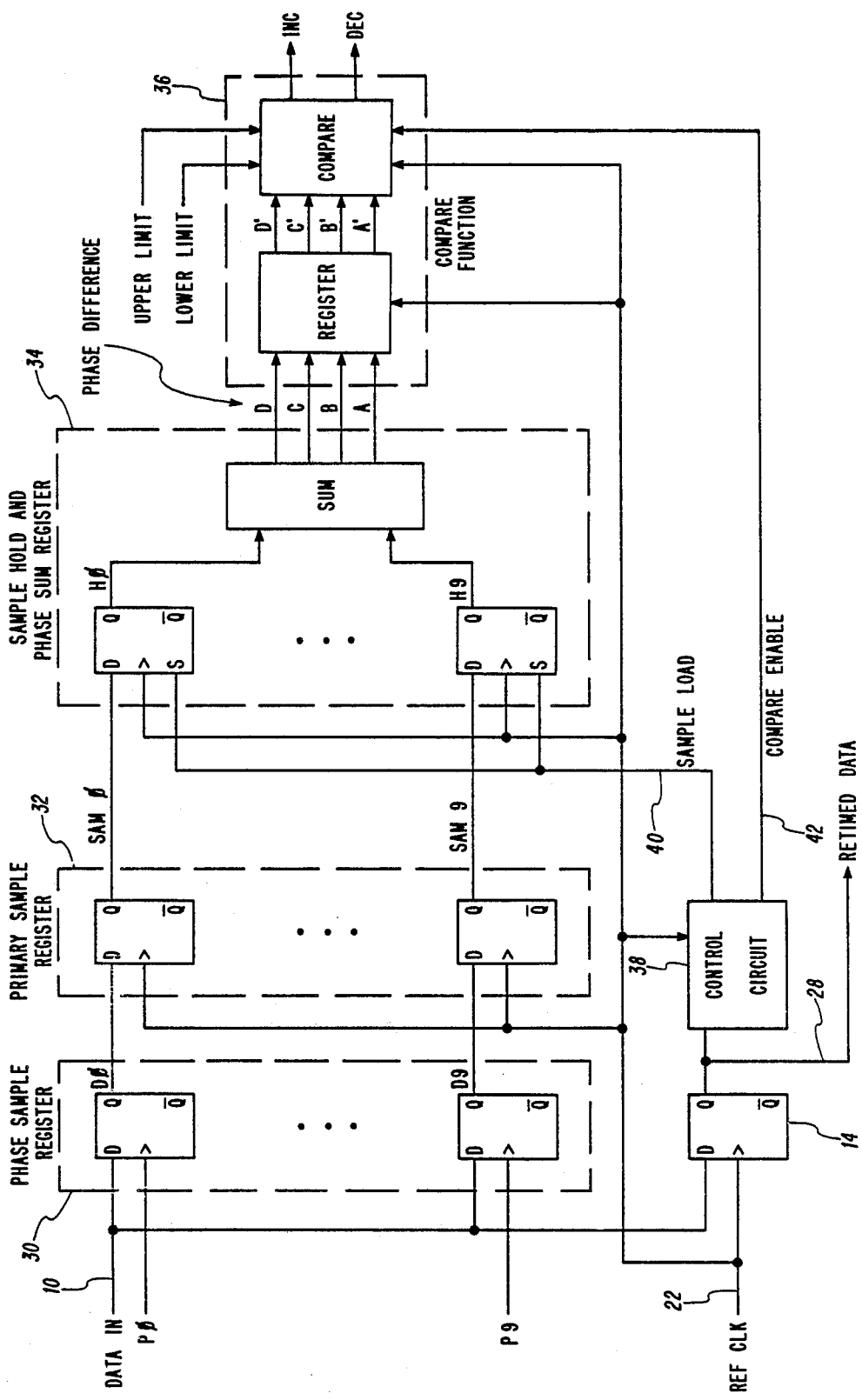
FIG. 2 is a block diagram of the phase detector portion of FIG. 1.

The phase detector of FIG. 2 is drawn in exactly the same form as shown in the referenced patent application and shows data being supplied on a lead 10 since this is the same lead as in FIG. 1 to a phase sample register 30. A reference clock 22, as well as a plurality (N) of D outputs from sample register 30, are supplied to a primary sample register 32. The reference clock lead 22 is supplied to a sample and hold register 34 along with a plurality of SAM or sample inputs from register 32. The register 34 holds and sums the signals on an appropriate basis and supplies these to a phase difference block 36 which provides phase altering increment and decrement signals as outputs. The input data on lead 10 is also supplied to a D flip-flop previously designated as 14 in FIG. 1 which is used to retime the data. The retimed data on lead 28 from D flip-flop 14 is also applied to a control circuit 38 within the phase detector which provides a sample load output on lead 40 and a compare enable output on lead 42. The sample load allows the loading only when the sample load signal on lead 40 is a logic 1. The compare enable provides a similar end result function to the compare function block 36.

Figure 3:
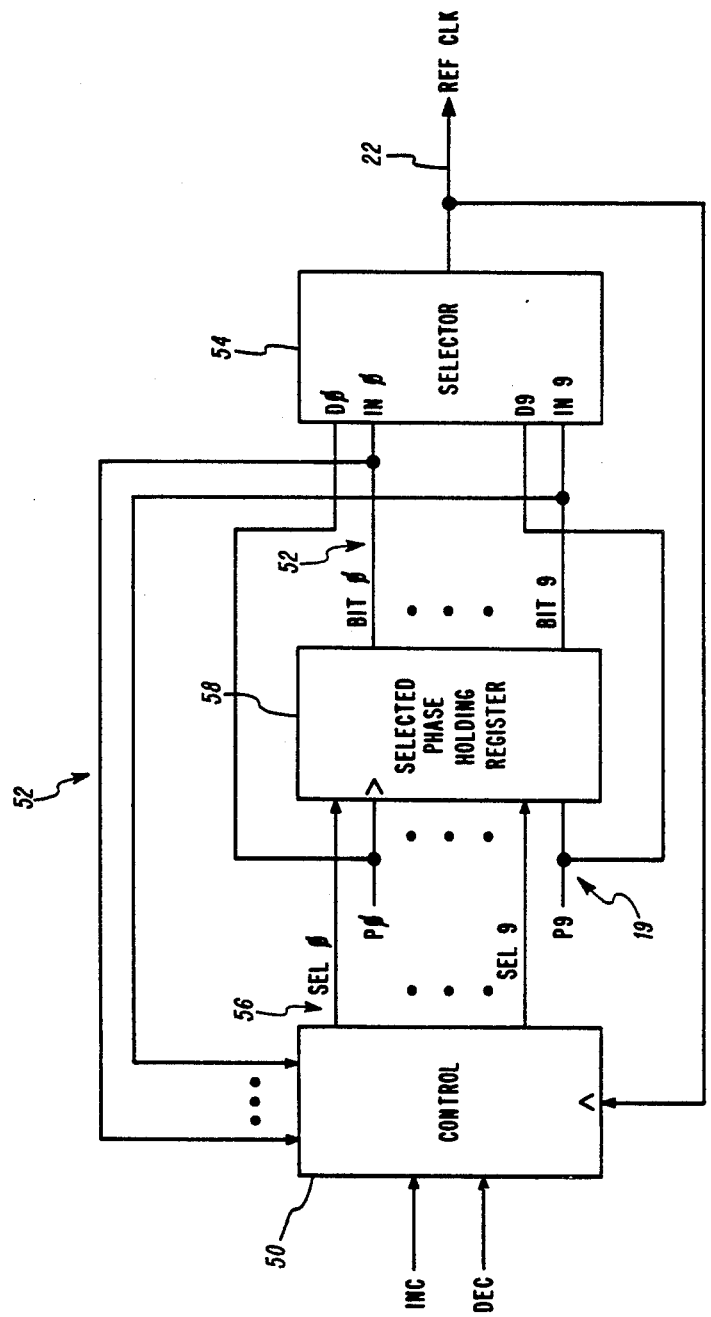
FIG. 3 is a block diagram of the oscillator portion of FIG. 1.

FIG. 3 illustrates the contents of the oscillator block 20 of FIG. 1 and, like FIG. 2, uses the designators of FIG. 1 where applicable. A control block 50 within the oscillator receives the increment and decrement signals and further receives a plurality of bit signals designated as 52 from a selector block 54. Finally, the control block 50 receives the reference clock signals on lead 22. A plurality of select outputs is provided from control block 50. These select outputs are designated generally as 56 and are provided to a selected phase holding register 58. The holding register 58 in addition receives the delay line generated P outputs and provides a plurality of bit outputs previously designated as 52. The outputs 52 are provided to the In terminals of selector 54 wherein a given bit lead has a corresponding P lead.

Figure 4:
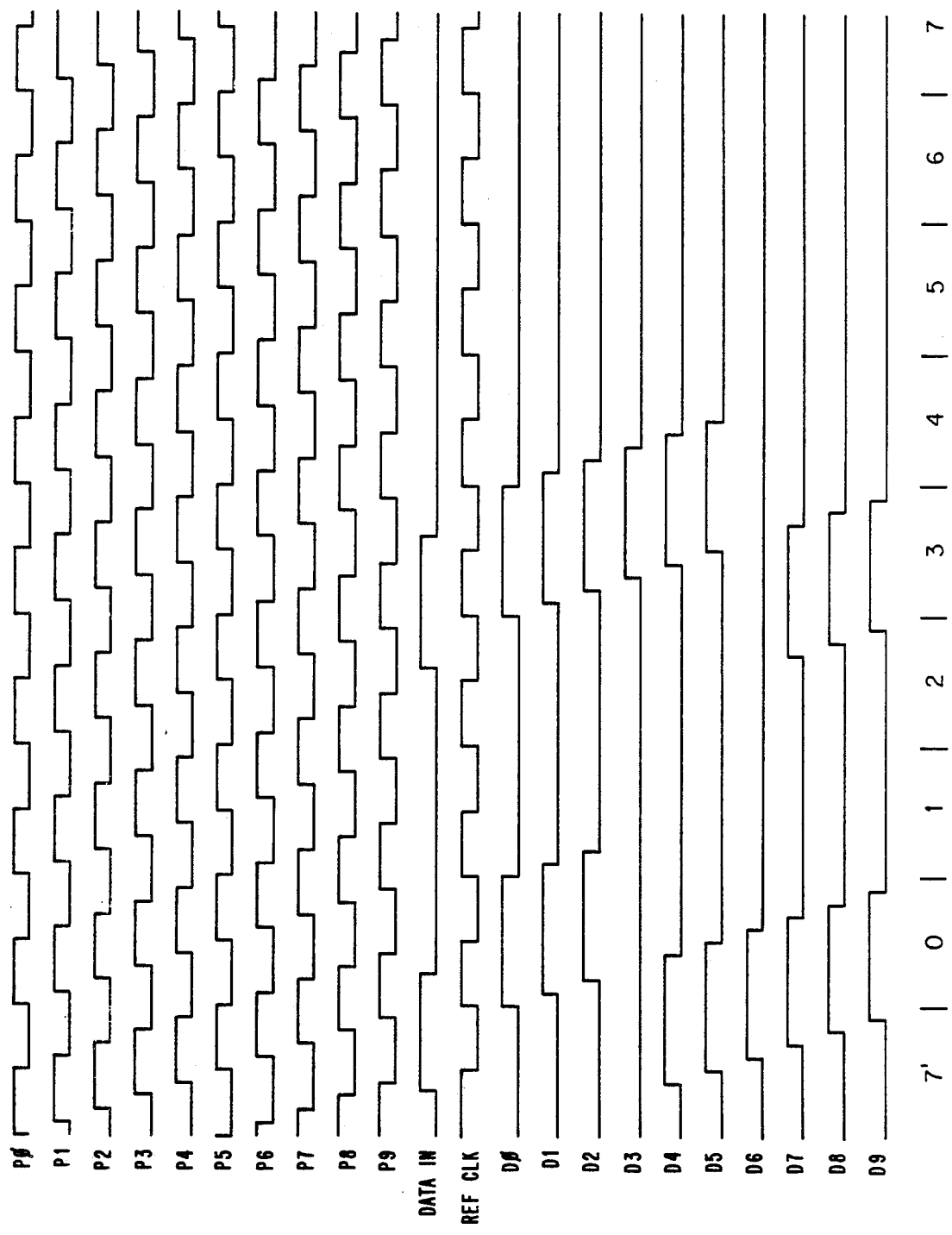
FIGS. 4, 5 and 6 are sets of waveforms which may be utilized in understanding the inventive concept.
Figure 5:
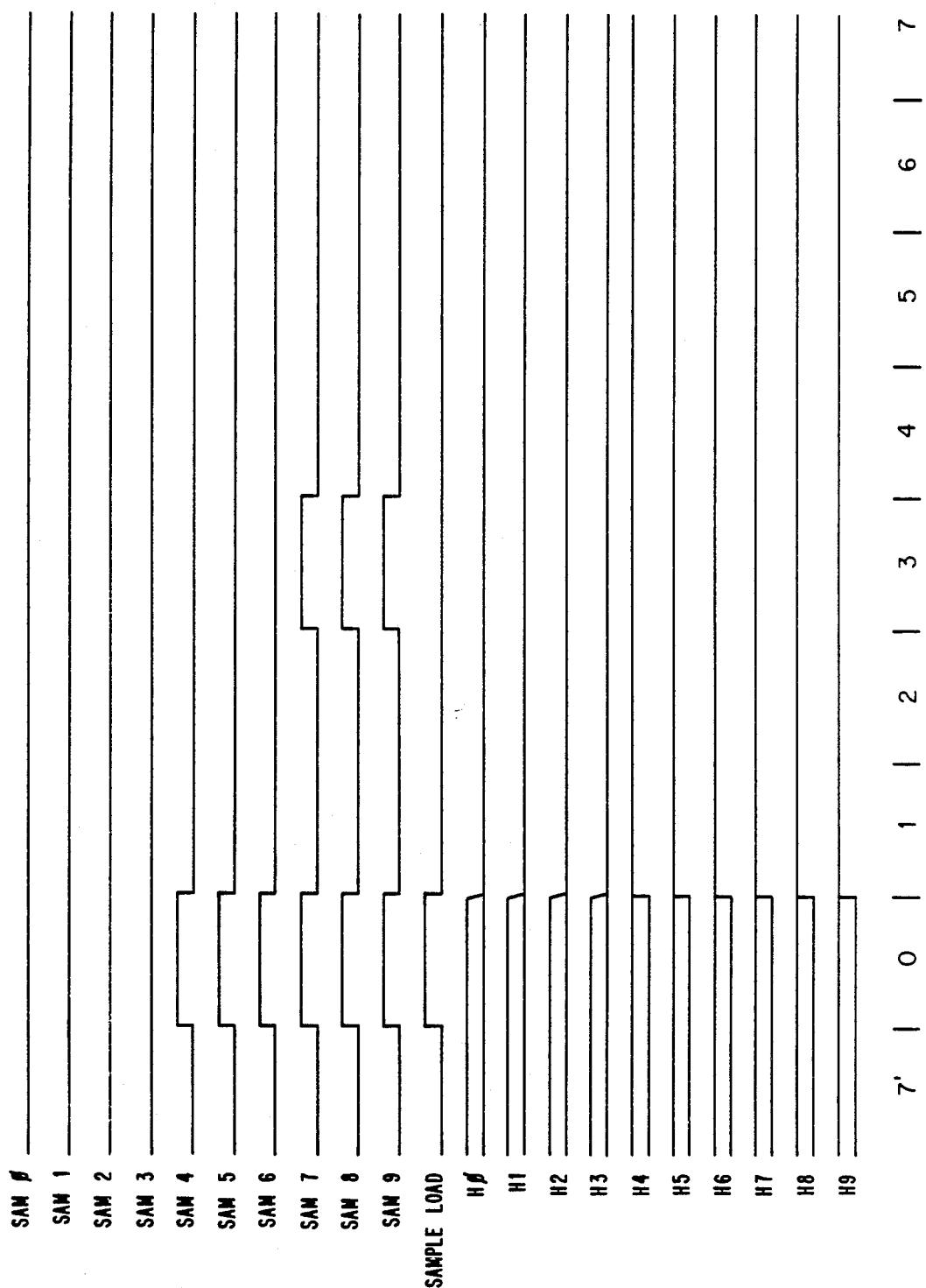
Figure 6:
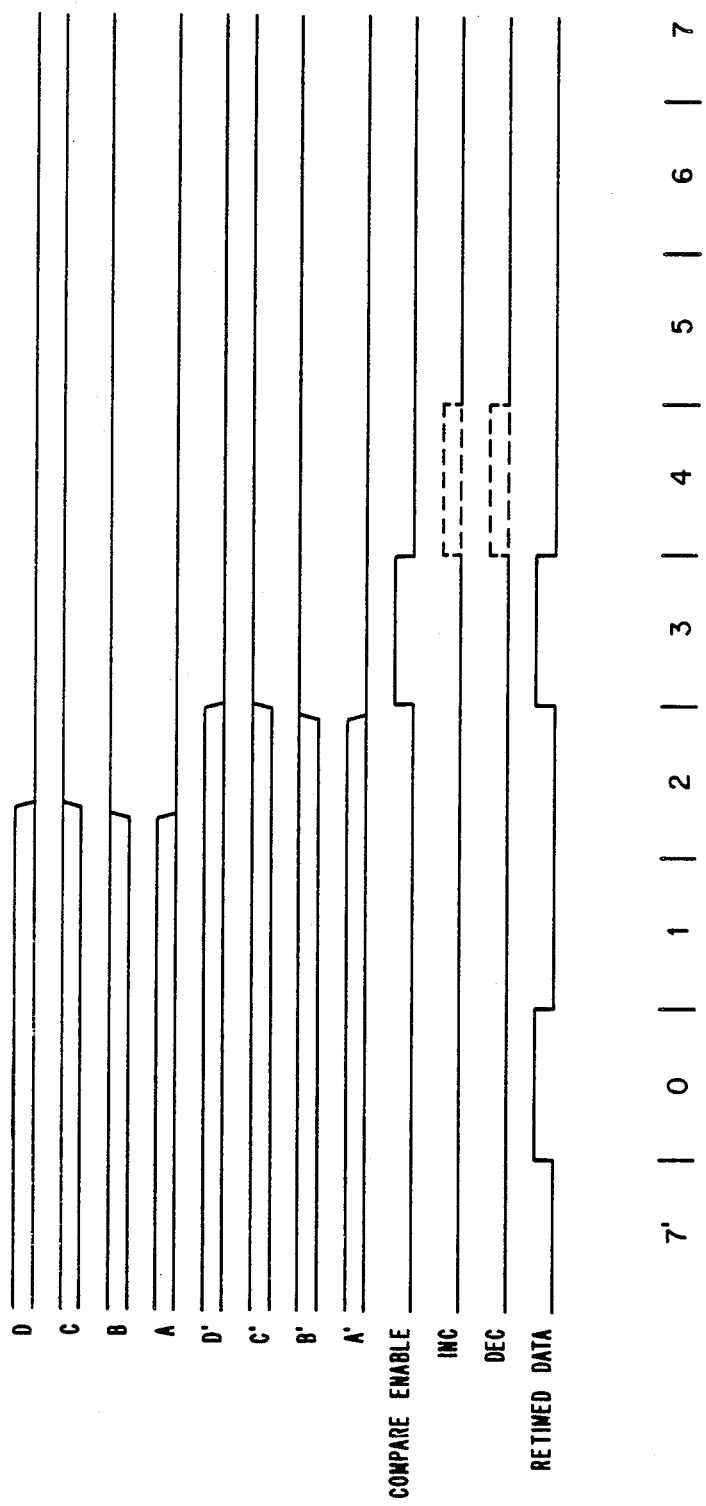

The designators adjacent the waveforms in each of the FIGS. 4, 5 and 6 are the same as used in FIGS. 1, 2 and 3 and thus, further designators are believed not required.

OPERATION

Although the operation of the oscillator of FIG. 3 may be ascertained in detail from the referenced copending application, a brief summary will be provided. The oscillator in a static condition uses one of the select lines 56 to select one of the signals P0 through P9 and shown as the set of leads 19. This selected signal is output as one of the leads Bit 0 through Bit 9 and further designated as 52. The signals 52, also under normal conditions, only have one lead active and this is used to direct one of the leads 19 through a summing network in selector 54 to output 22 as the reference clock. When a phase altering signal appears on either the increment or decrement lead supplied to control block 50, two of the select leads 56 are temporarily in a logic 1 state so that two of the phase signals are summed in selector 54. In this way, there is a "make-before-break" and there are no extra pulses appearing in the output line to falsely indicate a full cycle change in frequency. Rather, a normal occurrence of the phase altering signal is to change the phase by 360°/N where N is the number of phase leads 19. The present embodiment uses ten phase changing leads, thus, each phase altering signal alters the phase by 36 degrees. The reason that the make-before-break action is required is that there is always a finite time lag through a series of digital circuits. The control block 50 waits until there is an indication of two signals in a logic 1 condition in the set of leads 52 before deactivating the one that was active prior to the input of the phase altering signal. The oscillator then settles down to the new phase until another phase altering signal is received. The oscillator thus provides a reference clock output which is the same frequency as that provided on the set of leads 19 if no increment or decrement signals are received and can deviate therefrom an amount dependent upon the total time required for the circuit to complete a phase change operation. In one embodiment of this invention, six cycles were used within the control block as a delay before it would accept a further phase altering signal. Although the circuit would typically complete all of the operations necessary to a phase alteration within four time periods, the use of six gave complete assurance that the circuit would have time to settle down. Thus, for this embodiment of the invention, the frequency change at the output 22 from that supplied on leads 19 would be equal to 1/60 or a little less than 2%. For a 50 megahertz signal as supplied on lead 16, this would be a maximum deviation of about 800 kilohertz. The figure of 60 is obtained by multiplying the six time periods for each correction times the number of potential corrections which would be the ten different phase delay increments since the oscillator can only perform one increment at a time and because the phase altering signals must be continually supplied in order to maintain a difference in frequency between the output clock and the frequency of the signal as supplied to delay line 18.

The phase detector is also described in the co-pending patent application previously mentioned. This block obtains an indication of phase deviation of the input data with respect to the reference clock by checking the number of the different phase signals which have a 0 to 1 transition between the commencement of a data pulse and the commencement of the reference clock. The number of these phase signals which have this transition is indicative of the phase difference between the input data signal and the reference clock. This number or count is converted from a decimal number of active lines to a binary value through the use of a summing block within sample hold and phase sum register 34. The conversion is provided to ease the comparison in compare block 36. Within block 36 the binary number is compared to upper and lower limits and either an increment or decrement phase altering signal is output from the compare block if the binary input is outside the range of values defined by the upper and lower limits. This compare function is provided at a time coincident with the reference clock on lead 22 and the compare enable signal on lead 42. All of the various signals and their timings may be ascertained from the FIGS. 4 through 6 and a more complete description may be found in the referenced application.

In the description above, it is believed that the general operation of the oscillator and the phase detector is at least reasonably understood. The present invention lies in the combination of these two blocks along with the D flip-flop 14 to provide a digital data recovery or clock recovery circuit from non-return-to-zero data while using reasonably inexpensive circuitry which will not operate at a frequency which is substantially more than the frequency of the data being processed. As explained above, the data for the presently described embodiment of the invention, cannot vary more than 2% of the frequency of the signal being supplied to the delay line for the reference phases. The frequency deviation could be more if a lesser amount of phase discrimination may be tolerated, but one embodiment of the invention only required an 0.0002% deviation to accommodate incoming data.

Nyquist's theorem requires a sampling rate of at least twice the frequency of the incoming data and thus, the prior art required circuitry to operate at at least twice the frequency of the data. The present invention having a 6 time period delay and sampling at 2 times the maximum data rate would tolerate no more than a 10% difference between the sample rate and the data rate. But, at this sampling rate, the ability to accurately discriminate phase changes is diminished.

It is apparent from the above discussion, that the present invention accomplishes its objective and is able to digitally recover clock signals from a non-return-to-zero input data signal while using circuitry which cannot operate at a frequency which is substantially more than the repetition rate of the data.

While I have described a single embodiment of the inventive concept, it is apparent that the present invention can be practiced while using an analog oscillator for block 20 with the only detrimental effect being the slowed response time and the increased power usage that would result.

Other modifications will appear to those skilled in the art and thus, I wish to be limited not by the embodiments shown or commented upon but only by the scope of the appended claims wherein I claim:

1. Phase lock loop apparatus comprising, in combination:

phase signal first means for supplying a plurality N of first signals of a first frequency each having a phase difference with respect to an adjoining signal of 360°/N;

data signal second means for supplying a non-return-to-zero (NRZ) data second signal having a frequency approximately the same as said first frequency;

digital phase detector third means, connected to said first and second means to receive said first and second signals and including a reference clock signal input means and clock signal phase altering output means, for detecting the number of first signals occurring between the commencement of said second signal and the commencement of a given characteristic of a clock signal supplied to said reference clock signal input means thereof and supplying a phase altering output third signal if the number detected is outside an allowable range;

digitally controlled oscillator fourth means, connected to said first and third means to receive first and third signals and including reference clock signal output means, for generating a reference clock fourth signal at said clock signal output means thereof by always selecting at least one of said N first signals to be passed to said clock signal output means wherein only one of said N first signals is normally selected and when a phase altering signal is received from said third means, two selected signals are temporarily summed to provide the fourth signal in a make-before-break manner; and logic fifth means, connected to said second and fourth means to receive said second and fourth signals therefrom, for outputting a retimed data signal having a predetermined range of phase relationships with respect to the clock fourth signal.

2. Phase lock loop apparatus comprising, in combination:

phase signal first means for supplying a plurality N of first signals of a first frequency each having a phase difference with respect to an adjoining signal of 360°/N;

data signal second means for supplying a non-return-to-zero (NRZ) data second signal having a frequency approximately the same as said first frequency;

digital phase detector third means, connected to said first and second means to receive said first and second signals and including a reference clock signal input means and clock signal phase altering output means, for detecting the number of first signals occurring between the commencement of said second signal and the commencement of a given characteristic of a clock signal supplied to said reference clock signal input means thereof and supplying a phase altering output third signal if the number detected is outside an allowable range;

controlled oscillator fourth means, connected to said third means to receive said third signals therefrom and including reference clock signal output means, for generating a reference clock fourth signal at said clock signal output means thereof corrected in phase in accordance with the occurrence of said third signals; and logic fifth means, connected to said second and fourth means to receive said second and fourth signals therefrom, for outputting a retimed data signal having a predetermined range of phase relationships with respect to the clock fourth signal.

3. The method of recovering a clock signal from a non-return-to-zero (NRZ) data signal having a data bit repetition rate of frequency F using digital circuitry and a reference signal source that has a frequency of less than 2F comprising the steps of:

generating a plurality (N) of signals from said reference signal source wherein each of said N signals has a phase difference of 360°/N with respect to another of said N signals;

generating a frequency and phase controlled clock signal whose phase is altered in response to a phase altering control input signal;

detecting the number of said N signals commencing between the commencement of a data signal and the commencement of a given characteristic of said clock signal; and generating a phase altering control signal, for use in generating the clock signal, whenever the detected number of said N signals is outside an allowable range.

4. The method of claim 3 comprising the additional step of retiming the data, using the controlled clock signal, to have a given phase relationship with respect to the clock signal.

5. Apparatus for recovering a clock signal from a non-return-to-zero (NRZ) data signal having a data bit repetition rate of frequency F using digital circuitry and a reference signal source that has a frequency of less than 2F comprising, in combination:

data signal supplying first means for supplying data at a repetition rate having a frequency of F;

second means for generating a plurality (N) of signals from a reference signal source wherein each of said N signals has a phase difference of 360°/N with respect to another of said N signals and has a frequency of no greater than 2F;

controlled oscillator third means, including control input means and clock signal output means, for generating a frequency and phase controlled clock signal whose phase is altered in response to a phase altering control input signal;

phase detecting fourth means, connected to said first, second and third means and including control signal output means, for detecting the number of said N signals commencing between the commencement of a data signal and the commencement of a given characteristic of said clock signal; and fifth means, connected between said third and said fourth means, for generating a phase altering control signal, for use by said third means, whenever the detected number of said N signals is outside an allowable range.

* * * * *